(12) United States Patent  
Davaran

(10) Patent No.: US 9,229,483 B1  
(45) Date of Patent: Jan. 5, 2016

(54) RADIATION INHIBITING PERSONAL ELECTRONICS CASE

(71) Applicant: Shahriar Davaran, Great Neck, NY (US)

(72) Inventor: Shahriar Davaran, Great Neck, NY (US)

( * ) Notice: Subject to any disclaimer, the term of this patent is extended or adjusted under 35 U.S.C. 154(b) by 0 days.

(21) Appl. No.: 14/461,084

(22) Filed: Aug. 15, 2014

(51) Int. Cl.  
H05K 9/00 (2006.01)  
G06F 1/16 (2006.01)

(52) U.S. Cl.  
CPC ............ *G06F 1/1656* (2013.01); *H05K 9/0045* (2013.01)

(58) Field of Classification Search  
CPC .................................................. H05K 9/0045  
See application file for complete search history.

(56) References Cited

U.S. PATENT DOCUMENTS

| | | | | |
|---|---|---|---|---|
| 4,785,136 A * | 11/1988 | Mollet | ................. | G06F 1/182 174/363 |
| 5,134,245 A * | 7/1992 | Katz | ................. | G06F 1/1628 174/384 |
| 5,136,119 A * | 8/1992 | Leyland | ............... | H05K 9/0043 174/379 |
| 5,545,844 A * | 8/1996 | Plummer, III | ........ | H05K 9/0043 174/363 |
| 5,872,332 A * | 2/1999 | Verma | ................. | H05K 5/0047 174/373 |
| 5,965,842 A * | 10/1999 | Ganninger | ............. | H05K 3/32 174/377 |
| 6,576,832 B2 * | 6/2003 | Svarfvar | ............. | H05K 9/0047 174/392 |
| 6,593,524 B1 * | 7/2003 | Toedtman | ........... | H05K 9/0045 174/363 |
| 9,113,550 B2 * | 8/2015 | Ho | ....................... | H05K 9/0094 |
| 2009/0246381 A1 * | 10/2009 | Shi et al. | .............. | H05K 9/0045 427/259 |
| 2014/0009004 A1 * | 1/2014 | Schroeder | ........... | H05K 9/0043 307/326 |

* cited by examiner

*Primary Examiner* — Hung V Ngo  
(74) *Attorney, Agent, or Firm* — Gulf Coast Intellectual Property Group

(57) ABSTRACT

A personal electronics case that is operable to inhibit the transmission of radiation in the direction of a user. The personal electronics case includes four walls and a first bottom layer contiguously formed to define an interior volume. A cavity is adjacent and underneath the first bottom layer and is of similar size. Secured within the cavity is a radiation shield that is operable to inhibit the transmission of radiation. A second bottom layer is adjacent to the cavity opposite the first bottom layer. A keeper is mounted within a void in the body to facilitate the releasable securing of the radiation shield within the cavity.

4 Claims, 2 Drawing Sheets

RADIATION INHIBITING PERSONAL ELECTRONICS CASE

FIELD OF THE INVENTION

The present invention relates generally to protective cases, more specifically but not by way of limitation a case for a personal electronic device such as but not limited to a tablet pc or laptop computer wherein the case includes therein a layer of material operable to prevent transmission of radiation wave.

BACKGROUND

The proliferation of personal electronic devices in our society over the last decade has been significant. In the United States alone there are approximately two hundred and fifty million cellular phone devices that are active with various network providers. Additionally, devices such as laptop computers and tablet PC's also number in the hundreds of millions. These devices are now an integral part of most people's lives. The days of reading a newspaper or consuming information through other traditional media outlets such as television are gone. Most consumers engage a personal electronic device such as but not limited to a cellular phone or tablet PC at least two hours per day.

One problem with personal electronic devices is the radiation emitted therefrom. While cellular phones and their cellular transmission are well known, most consumers are unaware that personal electronics such as but not limited to tablet PC's and laptop computers also emit radiation when in use. Users of these devices often place the devices on their laps or sometimes the devices can be proximate the head of the user. This exposes the user to albeit small but an unknown quantity of radiation.

Personal electronic devices are often stored and carried in protective cases. These cases are designed to protect the personal electronic device from damage during use and in case of an accidental drop. Additionally, some of these cases are operable to protect against water and other environmental hazards. Conventional cases for electronic devices are manufactured from materials such as but not limited to plastic or rubber. One problem with this material is that the material does not prevent the transmission of radiation from the device or more specifically block the transmission so as to inhibit the transmission in the direction of the user.

Accordingly, there is a need for a personal electronics device that includes a radiation inhibiting layer integrated into the case so as to prevent the transmission of the radiation from the personal electronic to emit in the direction of the user.

SUMMARY OF THE INVENTION

It is the object of the present invention to provide a personal electronics case that is operable to inhibit transmission of radiation generated by the personal electronic device from transmitting in the direction of the user.

Another object of the present invention is to provide a personal electronics case operable to inhibit radiation transmission that includes a body having four walls and a bottom that are integrally formed to create a cavity operable to receive a personal electronic device.

A further object of the present invention is to provide a personal electronics case that includes a radiation transmission inhibiting layer secured within the bottom of the body of the case.

Still another object of the present is to provide a personal electronics case that includes a radiation transmission inhibiting layer wherein the radiation transmission inhibiting layer is configured to be integrated into the bottom of the body or configured to be removable so as to be transferred to another personal electronic case adapted to receive.

An additional object of the present invention is to provide a personal electronics case that includes a radiation transmission inhibiting layer wherein the radiation transmission inhibiting layer is manufactured from a metal.

Yet a further object of the present invention is to provide a personal electronics case that includes a radiation transmission inhibiting layer wherein the body of the personal electronics case includes therein a keeper operable to releasably secure the radiation transmission inhibiting layer.

To the accomplishment of the above and related objects the present invention may be embodied in the form illustrated in the accompanying drawings. Attention is called to the fact that the drawings are illustrative only. Variations are contemplated as being a part of the present invention, limited only by the scope of the claims.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
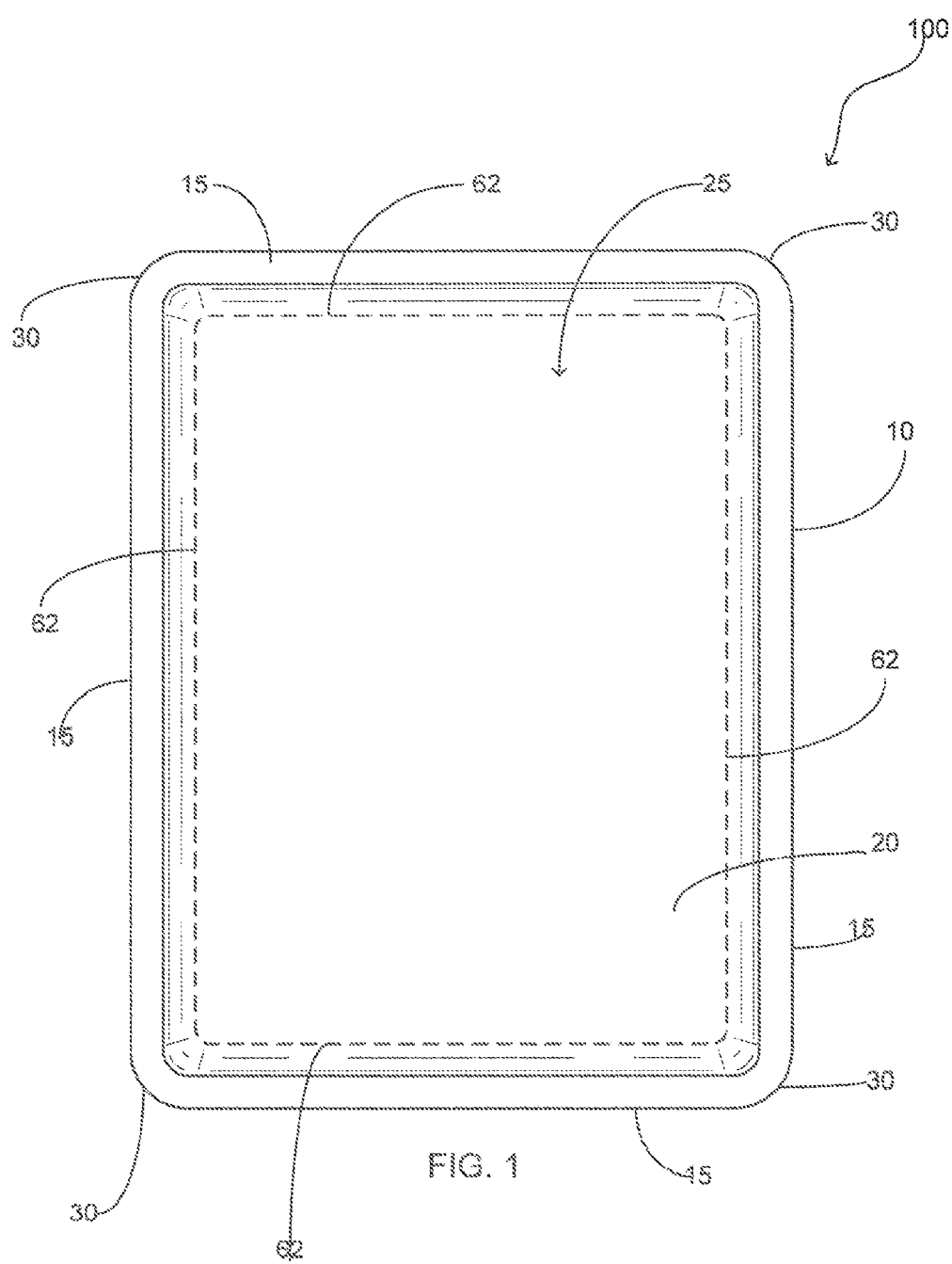
FIG. 1 is a top view of an embodiment of the present invention.

Referring now to the drawings submitted herewith, wherein various elements depicted therein are not necessarily drawn to scale and wherein through the views and figures like elements are referenced with identical reference numerals, there is illustrated a radiation transmission inhibiting personal electronics case 100 constructed according to the principles of the present invention.

An embodiment of the present invention is discussed herein with reference to the figures submitted herewith. Those skilled in the art will understand that the detailed description herein with respect to these figures is for explanatory purposes and that it is contemplated within the scope of the present invention that alternative embodiments are plausible. By way of example but not by way of limitation, those having skill in the art in light of the present teachings of the present invention will recognize a plurality of alternate and suitable approaches dependent upon the needs of the particular application to implement the functionality of any given detail described herein, beyond that of the particular implementation choices in the embodiment described herein. Various modifications and embodiments are within the scope of the present invention.

It is to be further understood that the present invention is not limited to the particular methodology, materials, uses and applications described herein, as these may vary. Furthermore, it is also to be understood that the terminology used herein is used for the purpose of describing particular embodiments only, and is not intended to limit the scope of the present invention. It must be noted that as used herein and in the claims, the singular forms "a", "an" and "the" include the plural reference unless the context clearly dictates otherwise. Thus, for example, a reference to "an element" is a reference to one or more elements and includes equivalents thereof known to those skilled in the art. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

References to "one embodiment", "an embodiment", "exemplary embodiments", and the like may indicate that the embodiment(s) of the invention so described may include a particular feature, structure or characteristic, but not every embodiment necessarily includes the particular feature, structure or characteristic.

Referring in particular to FIG. 1 herein the radiation transmission inhibiting personal electronics case 100 further includes a body 10. The body 10 includes four walls 15 and a first bottom layer 20 contiguously formed to create an interior volume 25. The body 10 is manufactured from a suitable durable material such as but not limited to plastic or rubber. The body is rectangular in shape having four rounded corners 30. While the embodiment illustrated herein is rectangular in shape, it is contemplated within the scope of the present invention that the body 10 could be formed in various different shapes having numerous different quantities of walls and further being made in different sizes so as to accommodate and releasably secure therein a personal electronic device. By way of example but not by way of limitation, the body 10 could be manufactured to receive a tablet PC, laptop computer, mp3 player or cellular phone. The interior volume 25 of the body 10 has sufficient capacity and depth to accommodate the aforementioned examples of personal electronic devices. The four walls 15 of the body 10 are manufactured of a resilient material in order to provide a frictional bias against the personal electronic device that has been placed within the interior volume 25. While the embodiment illustrated herein includes the four walls 15 of the body 10, it is contemplated within the scope of the present invention that the body 10 could be constructed without the four walls 15 in order to receive a personal electronics superposed thereon without releasably securing thereto. It is further contemplated within the scope of the present invention that the body 10 could be manufactured in a plurality of different colors.

Figure 2:
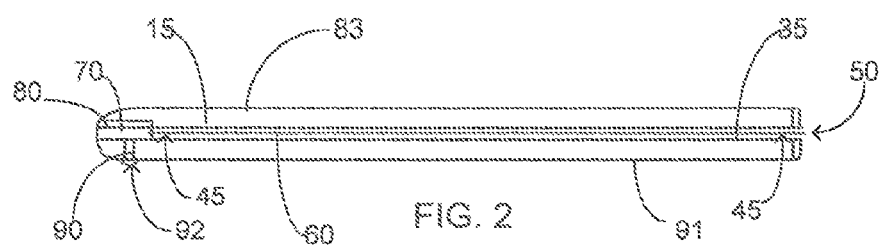
FIG. 2 is a cross sectional diagrammatic view of the present invention.
Figure 3:
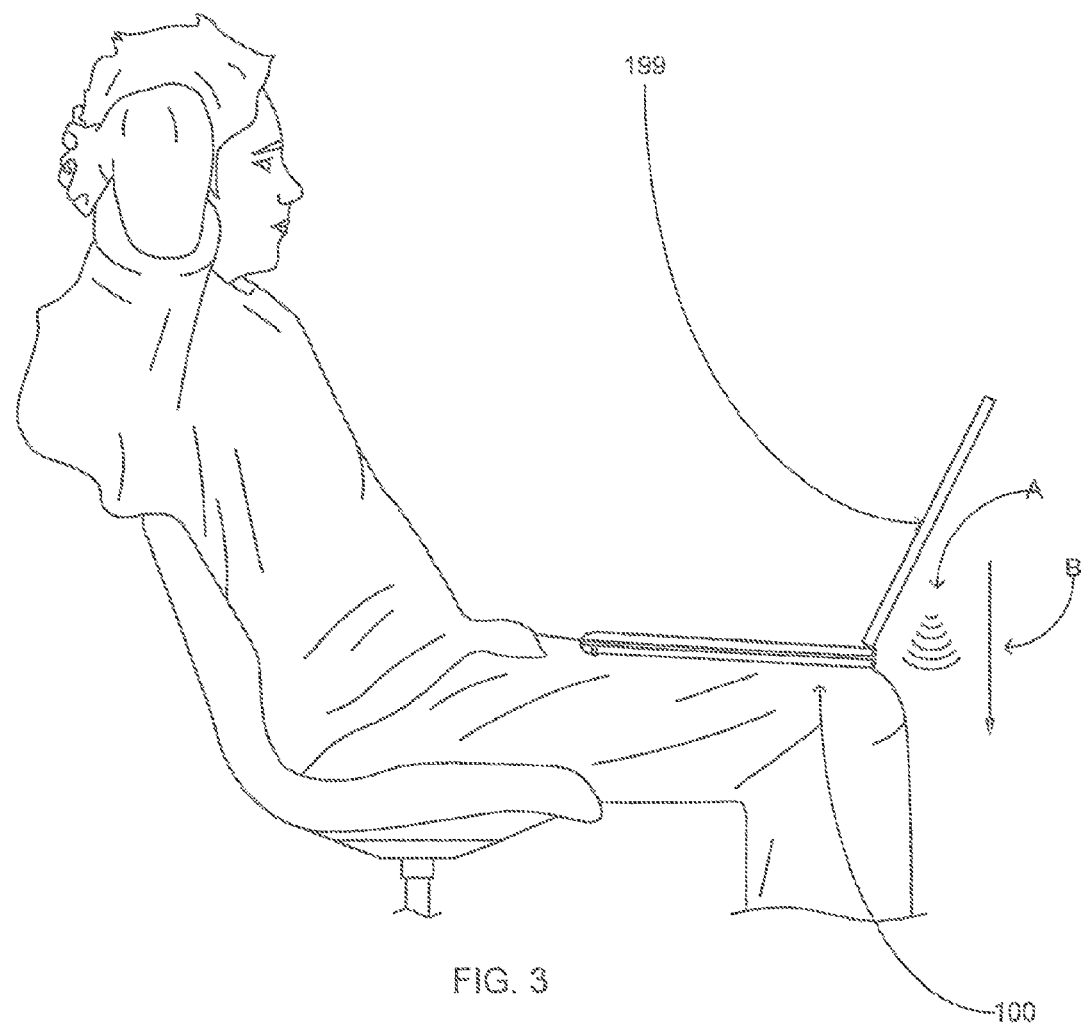
FIG. 3 is an environmental illustration showing the present invention coupled to a laptop computer.

As illustrated in FIG. 2 herein, the body 10 includes cavity 35. Cavity 35 is immediately below the first bottom layer 20 and is rectangular in shape having a first end 40 and a second end 45. Proximate second end 45 is opening 50 that is operable to provide access to the cavity 35. The cavity 35 is configured to receive a radiation shield 60 such as but not limited to lead or steel. The radiation shield 60 is equivalent in size to the first bottom 20 such that the radiation shield 60 extends such that the edges 62 thereof are proximate the four walls 15. Extension of the edges 62 is important as the edges 62 will be in axial alignment with an edge of a personal electronic device that has been disposed within the interior volume 25. The alignment of edges 62 with edges of a personal electronic device ensures the substantial blocking of any radiation transmission through the second bottom 91 by a personal electronic device. As is known in the art, personal electronic devices such as laptop computers and tablet PC's emit small doses of radiation during use. The health effects of this radiation is still unknown and it is desirable to eliminate the transmission of radiation in the direction of the user. By way of example but not limitation, the radiation shield 60 will substantially inhibit radiation wave transmission therethrough so during use of a personal electronic device on a user's lap, the user's lap is shielded from the radiation transmission of the device. Referring in particular to FIG. 3 herein, the personal electronics case 100 is shown coupled with an exemplary laptop computer 199. As shown by reference arrow B and exemplary radiation waves A, the laptop computer emits radiation that is directed towards the user. The personal electronics case having the radiation shield 60 and other elements discussed herein inhibits the transmission of radiation waves therethrough so as to prevent absorption of the radiation waves by the user of the exemplary laptop computer 199.

Still referring to FIG. 2, it is contemplated within the scope of the present invention that the radiation shield 60 could be either permanently installed within the cavity 35 or be configured such that the radiation shield 60 is removable so as to be transferred to another embodiment of the radiation transmission inhibiting personal electronics case 100. In a removable embodiment, the body 10 includes a keeper 70 proximate the first end 45 of the cavity 35. The keeper 70 is operable to couple to the radiation shield 60 and retain within the cavity 35. It is contemplated within the scope of the present invention that the keeper 70 could be a mechanical fastener or a magnet wherein either is configured to releasably secure to the radiation shield 60. The keeper 70 is movably mounted within the body 10 within void 80. Void 80 provides sufficient space for the keeper 70 to be moved intermediate its first position and its second position. In the first position the keeper 70 is operably coupled to the radiation blocking material 60 so as to secure within the cavity 35. In the second position, the keeper 70 is moved upward toward perimeter edge 83 so as to disengage from the radiation shield 60. The keeper 70 is moved intermediate its first position and its second position by button 90. Button 90 is movably secured within body 10 utilizing suitable durable techniques and provides an interface for a user to facilitate the operation of the keeper 70. The button 90 includes head 92 that extends outward from the second bottom layer 91. Those skilled in the art will recognize that the keeper 70 could be operably coupled within the body 10 in numerous different manners so as to enable the operation as described herein.

In the preceding detailed description, reference has been made to the accompanying drawings that form a part hereof, and in which are shown by way of illustration specific embodiments in which the invention may be practiced. These embodiments, and certain variants thereof, have been described in sufficient detail to enable those skilled in the art to practice the invention. It is to be understood that other suitable embodiments may be utilized and that logical changes may be made without departing from the spirit or scope of the invention. The description may omit certain information known to those skilled in the art. The preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. A personal electronic case operable to inhibit transmission of radiation in the direction of a user comprising:
   a body, said body having a plurality of walls and a bottom, said body being planar in manner having a surface suitable to receive an electronic device superposed thereon;
   a radiation shield, said radiation shield being adjacent to said bottom, said radiation shield being secured within a cavity formed in said body, said radiation shield being integrally secured within said cavity of said body, said radiation shield being removably secured within said cavity of said body, said radiation shield being approximately equivalent in size to said bottom, said radiation shield operable to prevent transmission of radiation therepast;

a keeper, said keeper being mounted within a void in said body, said keeper being operably coupled to said radiation shield, said keeper operable to facilitate the releasable securing of said radiation shield within said cavity;

a button, said button being movably secured within said body, said button operably coupled to said keeper, said button operable to move said keeper intermediate a first position and a second position; and wherein said keeper is selected from a group of one of the following: mechanical fastener or magnet.

2. The personal electronic case as recited in claim 1, wherein said body further includes a second bottom layer, said second bottom layer being underneath said cavity.

3. A personal electronic case operable to shield radiation emission therefrom such that the radiation is not transmitted in the direction of a user comprising:

a body, said body having four walls and a bottom contiguously formed, said four walls and said bottom forming an interior volume being of sufficient size to accommodate a personal electronic, said four walls being resilient so as to bias against a personal electronic disposed within said interior volume;

a cavity, said cavity being underneath said bottom, said cavity being integrally formed in said body, said cavity having an opening, said cavity being of similar size as said bottom;

a void, said void adjacent said cavity distal to said opening of said cavity;

a radiation shield, said radiation shield being disposed within said cavity, said radiation shield being releasably secured within said cavity, said radiation shield being of similar size as said bottom, said radiation shield operable to inhibit transmission of radiation therethrough;

a keeper, said keeper being movably mounted within said void, said keeper being configured to operably couple to said radiation shield, said keeper having a first position and a second position;

a button, said button being movably secured within said body, said button operably coupled to said keeper, said button operable to move said keeper intermediate said first position and said second position; and wherein said radiation shield is manufactured from a material selected from one of the following group: lead or steel.

4. The personal electronic case as recited in claim 3, wherein said keeper is selected from a group of one of the following: mechanical fastener or magnet.

\* \* \* \* \*